(12) United States Patent
Desalvo et al.

(10) Patent No.: US 12,635,082 B2
(45) Date of Patent: May 19, 2026

(54) SINGLE STEP ELECTROLYTIC METHOD OF FILLING THROUGH-HOLES IN PRINTED CIRCUIT BOARDS AND OTHER SUBSTRATES

(71) Applicant: MacDermid Enthone Inc., Waterbury, CT (US)

(72) Inventors: Donald Desalvo, Jiangsu Province (CN); Ron Blake, Oxford, CT (US); Carmichael Gugliotti, Bristol, CT (US); William J. Decesare, Wolcott, CT (US); Richard A. Bellemare, Watertown, CT (US)

(73) Assignee: MacDermid Enthone Inc., Waterbury, CT (US)

( * ) Notice: Subject to any disclaimer, the term of this patent is extended or adjusted under 35 U.S.C. 154(b) by 179 days.

(21) Appl. No.: 18/289,075

(22) PCT Filed: May 10, 2022

(86) PCT No.: PCT/US2022/028462
§ 371 (c)(1),
(2) Date: Oct. 31, 2023

(87) PCT Pub. No.: WO2022/245576
PCT Pub. Date: Nov. 24, 2022

(65) Prior Publication Data
US 2024/0224432 A1 Jul. 4, 2024

Related U.S. Application Data

(60) Provisional application No. 63/189,640, filed on May 17, 2021.

(51) Int. Cl.
| | |
|---|---|
| *H05K 3/42* | (2006.01) |
| *C25D 3/38* | (2006.01) |
| *C25D 5/18* | (2006.01) |
| *C25D 7/00* | (2006.01) |
| *H05K 1/11* | (2006.01) |

(52) U.S. Cl.
CPC .............. *H05K 3/424* (2013.01); *C25D 3/38* (2013.01); *C25D 5/18* (2013.01); *C25D 7/00* (2013.01);
(Continued)

(58) Field of Classification Search
CPC .................. H05K 3/424; H05K 1/115; H05K 2201/09563; H05K 2203/0723;
(Continued)

(56) References Cited

U.S. PATENT DOCUMENTS

| | | | |
|---|---|---|---|
| 6,368,965 B1 * | 4/2002 | Lopatin ............. | H01L 21/76877 257/E21.585 |
| 6,524,461 B2 * | 2/2003 | Taylor ................... | C25D 5/611 205/920 |

(Continued)

FOREIGN PATENT DOCUMENTS

| | | | | |
|---|---|---|---|---|
| CN | 111101174 A | * | 5/2020 | .............. C25D 5/18 |
| KR | 20010092658 A | | 10/2001 | |

(Continued)

*Primary Examiner* — Thomas J Hong
*Assistant Examiner* — Jose K Abraham
(74) *Attorney, Agent, or Firm* — Carmody Torrance Sandak & Hennessey LLP

(57) ABSTRACT

A method of copper electroplating in the manufacture of printed circuit boards. The method is used for filling through-holes and micro-vias with copper. The method includes the steps of: (1) preparing an electronic substrate to receive copper electroplating thereon; (2) forming at least one of one or more through-holes and/or one or more micro-vias in the electronic substrate; and (3) electroplating copper in the at least one or more through-holes and/or one or more blind micro-vias by contacting the electronic substrate with an acid copper electrolyte. The acid copper electrolyte is used to plate the one or more through-holes and/or the one or more blind micro-vias. A first pulse reverse plating waveform sequence is used to create a copper bridge (Continued)

Start

Bridge

Shape

Fill in the center of the through-holes followed by direct plating until metallization is complete.

21 Claims, 3 Drawing Sheets

(52) U.S. Cl.
CPC ... *H05K 1/115* (2013.01); *H05K 2201/09563* (2013.01); *H05K 2203/0723* (2013.01)

(58) Field of Classification Search
CPC .. H05K 2203/1492; H05K 3/423; C25D 3/38; C25D 5/18; C25D 7/00; C25D 17/00
See application file for complete search history.

(56) References Cited

U.S. PATENT DOCUMENTS

| | | | | |
|---|---|---|---|---|
| 6,827,833 | B2 * | 12/2004 | Taylor | C25D 5/18 |
| | | | | 205/125 |
| 7,887,693 | B2 | 2/2011 | Nikolova et al. | |
| 2001/0023830 | A1 | 9/2001 | Inoue et al. | |
| 2003/0221967 | A1 | 12/2003 | Tsuchida et al. | |
| 2005/0145499 | A1 * | 7/2005 | Kovarsky | H01L 21/76873 |
| | | | | 205/103 |
| 2007/0158204 | A1 * | 7/2007 | Taylor | C25D 5/627 |
| | | | | 205/300 |
| 2009/0301889 | A1 * | 12/2009 | Reents | H05K 3/423 |
| | | | | 205/80 |
| 2010/0219081 | A1 | 9/2010 | Isono et al. | |
| 2014/0042032 | A1 * | 2/2014 | Shimoyama | C25D 5/02 |
| | | | | 204/230.2 |
| 2015/0156888 | A1 * | 6/2015 | Kawai | C25D 5/617 |
| | | | | 205/125 |
| 2015/0289387 | A1 | 10/2015 | Mirkovic et al. | |
| 2018/0010258 | A1 * | 1/2018 | Fujiwara | C25D 5/18 |
| 2020/0080217 | A1 | 3/2020 | Fujiwara et al. | |
| 2021/0130970 | A1 | 5/2021 | Desalvo et al. | |

FOREIGN PATENT DOCUMENTS

| | | |
|---|---|---|
| KR | 20030061692 A | 7/2003 |
| KR | 20130001368 A | 1/2013 |

* cited by examiner

Single Chemistry: Through Hole Filling

SINGLE STEP ELECTROLYTIC METHOD OF FILLING THROUGH-HOLES IN PRINTED CIRCUIT BOARDS AND OTHER SUBSTRATES

FIELD OF THE INVENTION

The present invention relates generally to an electrolytic deposition method for metallizing electronic substrates.

BACKGROUND OF THE INVENTION

Electrolytic metal plating solutions are used in many industrial applications, including anticorrosion and decorative coatings, and in the electronics industry for metallizing substrates used in electronic devices, including substrates that include one or more vias, through-holes, and trenches. For example, printed circuit boards, printed wiring boards and other similar substrates may be metallized with electrolytic copper. Copper has a better electrical conductivity than many other metals and allows for smaller features application. Aqueous copper baths, including baths based on sulfuric acid and methane sulfonic acid, are used for the fabrication of printed circuit boards (PCB) and semiconductors.

Interconnect features are features such as blind micro-vias (BMV), trenches and through-holes that are formed in a dielectric substrate. These features are metallized, preferably with copper, to render the interconnect electrically conductive. During circuit fabrication, copper is electroplated over select portions of the surface of the printed circuit board, into blind vias and trenches and onto the wall of through-holes passing between the surfaces of the circuit board base material. The walls of the through-boles are metallized to provide conductivity between the circuit layers of the printed circuit boards.

As electronic devices shrink and get packed closer together on circuit boards, heat management of electronics becomes an issue. Many electronic devices are sensitive to heat, which can make them less efficient and shorten their life. Thus, it is necessary to manage heat dissipation and provide a way to draw heat away from heat-generating components and direct it to other areas of a panel or other substrate for dissipation.

In circuit board modules and electronic devices, electronic components mounted on the circuit board include surface mounting-type electronic components and insertion mounting-type electronic components. Surface mounting-type electronic component are typically mounted on a board by soldering a terminal to a copper foil provided on a front surface of the circuit board. Insertion mounting-type electronic components are typically mounted on the board by inserting a lead terminal into a penetrating hole provided in the circuit board and soldering the lead terminal.

Electronic components mounted on the circuit board emit heat when current flows through them. In addition, large amounts of heat can be generated in electronic components in which large current flows. When the temperature of the electronic component or the circuit board rises excessively due to beat emitted by the electronic component, there is a concern that an electronic component or an electric circuit formed on the circuit board can malfunction.

Various methods have been developed to manage heat dissipation in electronic devices including, for example, filling through holes with conductive metal-filled epoxy plugging material, inserting copper coins under devices, inserting heat pumps into the circuit boards, the use of conductive adhesives, attachment of heat sinks to the heat generating devices, and electroplating of copper.

Resin or paste plugging of through-holes has been part of the build-up technology in high density interconnect constructions and IC substrates for many years. However, increasing circuit density and stacked via constructions coupled with higher power devices have added an extra dimension of thermal management. It has been found that solid copper filling of through-holes offers many advantages over resin or paste plugging including, for example, reducing the CTE mismatch, providing a stable platform for stacking microvias, and offering thermal management properties for high power devices.

However, the miniaturization of electronic devices involves a combination of thinner core materials, reduced line widths and smaller diameter through-holes. Filling the through-holes by copper plating has become more and more difficult with higher aspect ratios, often resulting in larger voids and deeper dimples. Another problem with through-hole filling is the manner of filling. Unlike vias which are closed at one end and fill from bottom to top, through-holes pass through a substrate and are open at two ends. When through-holes are being filled with copper, plating parameters and bath additives are chosen so that the copper begins to deposit on the walls at the center of the through-hole where it bridges at the center to form two blind vias as shown in FIG. 1.

Plating bath additives enable the right type of fill. If the right combination of additives is not chosen, the copper plating can result in undesired conformal copper deposition on the sides of the through-holes rather than filling of the through-holes.

One problem with through-hole plating is that the copper fails to completely fill the through-hole and both ends remain unfilled. An incomplete through-hole fill in which the middle of the hole does not fully close can result in large cavities in the center of the hole as the tops and bottoms of the hole close off due to the deposit preferentially thickening from what is referred to as "dog-boning". The result is a pinching off of the top and bottom and cavities in the center. Another issue is the incomplete filling of the holes after a bridge is formed across the center of the hole leaving deep depressions or open spaces at the tops and bottoms of the hole. The open spaces at the top and bottom of the holes are referred to as "dimples". Thus, it is desirable that the through-hole filling process be optimized to completely fill the hole and eliminate the presence of dimples. An ideal process completely fills through-holes with a high degree of planarity, i.e., build up consistency, without voids, to provide optimum reliability and electrical properties and at as low as possible a surface thickness for optimum line width and impedance control in an electrical device.

In order to address these problems, it is common to use two different copper electrolytes. A first copper bath is used to fill the through-holes until a bridge is formed, creating two blind vias and then a second bath having a substantially different formulation specifically directed to filling blind vias replaces the first bath to complete the filling process, which is both time consuming and inefficient. The through-hole filling process must be closely monitored to gauge the time when the first bath where the bridge is formed must be replaced with a via filling bath for the final filling of the via and failure to change baths at the correct time can result in dimple and void formation. Moreover, using two distinct plating baths for a single process increases the cost to both the manufacture and the customer.

U.S. Pat. Pub. No. 2021/0130970 to Desalvo et al., the subject matter of which is herein incorporated by reference describes a method of filling through-holes and vias with copper in the fabrication of printed circuit board, printed wiring boards, and other electronic substrates.

SUMMARY OF THE INVENTION

It is an object of the present invention to provide a reliable method of metallizing through-holes and vias (including microvias) with high aspect ratios and without any voids or defects.

It is another object of the present invention to provide a reliable method of metallizing through-holes and vias in a plating process arranged in a vertical configuration.

It is another object of the present invention to provide a reliable method of metallizing through-holes and vias in a plating process arranged in a horizontal configuration.

It is still another object of the present invention to provide an improved method of dissipating heat in a circuit board by metallizing through holes with copper and in which the resulting solid copper structures, when locating beneath heat generating devices, are capable of providing an effective means of transporting heat or thermal energy from these devices to areas of the circuit board, panel, or other electronic substrate, where it can be harmlessly dissipated It is still another object of the present invention to provide a one-step process for filling copper through holes in a copper electrolyte, which shortens the number of tanks in a line, reducing equipment costs, reducing the number of tanks to analyze and maintain, and reduces the number of rectifiers required for plating.

It is still another object of the present invention to eliminate potential separation issues between the via fill plating and bridge plating realized by other processes.

The present invention provides a method for electrolytically filling through holes in electronic substrates, such as printed circuit boards or printed wiring boards, with copper in a single-step, single solution plating process. The method described herein provides circuit designers with a method for heat management of electronic systems where higher packing of higher power heat generating devices is needed. The resulting solid copper structures, when located beneath heat generating devices, provide an effective means of transporting heat energy from these devices to other areas of the panel where it can be harmlessly dissipated. The result is devices that operate more efficiently and that exhibit a longer life.

In one embodiment, the present invention comprises a method of plating a metal on an electronic substrate, wherein the electronic substrate comprises one or more features, wherein the one or more features comprise one of one or more through-holes and/or one or more micro-vias in the electronic substrate, the method comprising the steps of:

a) preparing the electronic substrate to receive metal plating thereon;

b) bringing the electronic substrate and at least one counter electrode into contact with an acid copper electroplating bath comprising a source of copper ions to be plated;

c) electrically polarizing first and second sides of the electronic substrate to initiate metal plating thereon, wherein the acid copper electroplating bath plates the one or more through-holes and/or the one or more micro-vias using a plating cycle until metallization is complete;

wherein the plating cycle comprising the steps of, in order:

1) pulse plating for a first time period on a first side and a second side of the electronic substrate to cause copper to preferentially plate in the center of the one or more through-holes, wherein the copper merges together in the center of the hole to form two opposing blind vias; and 2) direct plating for a second time period to fill the two opposing blind vias formed by pulse plating;

wherein the pulse plating step comprises applying an electrical current to electrodeposit metal from the acid copper electroplating bath to the first side and second side of the electronic substrate, wherein the electrical current is applied as a pulse plating cycle comprising a repeatable sequence, the repeatable sequence comprising a set of pulse plating periods, the set of pulse plating periods including, in any order:

(i) at least a first forward pulse period;

(ii) at least a first reverse pulse period;

(ii) at least a second forward pulse period; and (iv) at least a rest period.

The pulse plating step forms the proper bridge across the center of the hole. The additives are chosen to give good bottom up via filling of the resulting blind microvias. Without proper additives, the blind microvias will either not fill, leaving large dimples or will pinch off at the tops due to dog boning leaving cavities within the blind microvia along with unacceptable dimples.

DETAILED DESCRIPTION OF THE PREFERRED EMBODIMENTS

Figure 1:
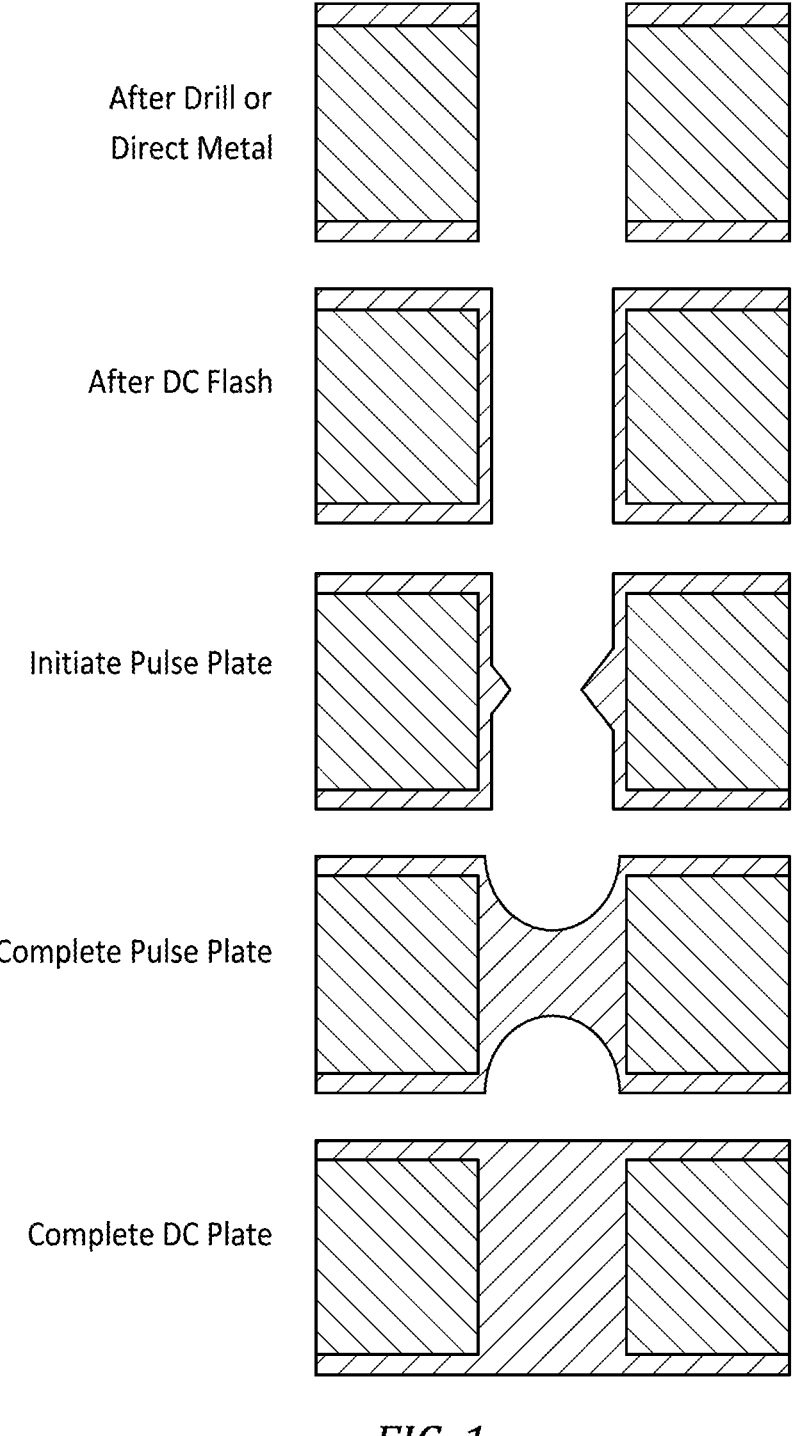
FIG. 1 depicts the steps of the single chemistry through-hole plating of copper.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform herein. Furthermore, it is also to be understood that the value to which the modifier "about" refers is itself specifically disclosed herein.

As used herein, spatially relative terms, such as "beneath", "below", "lower", "above", "upper" and the like, are used for ease of description to describe one element or feature's relationship to another element(s) or feature(s) as illustrated in the figures. It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

As used herein the term "substantially-free" or "essentially-free" if not otherwise defined herein for a particular element or compound means that a given element or compound is not detectable by ordinary analytical means that are well known to those skilled in the art of metal plating for bath analysis. Such methods typically include atomic absorption spectrometry, titration, UV-Vis analysis, secondary ion mass spectrometry, and other commonly available analytically methods.

The terms "printed circuit board" and "printed wiring board" are used interchangeably throughout this specification.

The terms "plating" and "electroplating" are used interchangeably throughout this specification.

As used herein, the term "immediately" means that there are no intervening steps.

As used herein, the term "dimple" refers to a depression in the bridge or conformal copper plating layer over the filled through-holes and/or blind micro-vias.

As used herein, the term "asynchronous wave" refers to a waveform that during plating, when periodic pulse reverse rectification is supplied separately to a first side and a second side of a substrate, the waveforms supplied to each side are either phase shifted or completely different from each other.

As used herein the term "synchronous wave" refers to a waveform that during plating, when periodic pulse reverse rectification is supplied separately to a first side and a second side of a substrate, the waveforms supplied to each side are identical and in phase and are synchronous.

One of the benefits of the present invention is that plating, especially copper plating, is already a part of the PCB manufacturing process, so being able to use copper plating to fill a through-hole eliminates the need for other processes such as plugging and sanding, copper coining, etc.

Furthermore, the use of pure copper provides a much higher thermal conductivity than conductive plugs and adhesives. Thus, there is an added benefit of thermal conductivity if it is needed.

Finally, in one embodiment, the process allows for the complete filling of through-holes in a single step in a single copper electrolyte. The benefits of using a single electrolyte include shortening the number of tanks in a line and thus equipment costs, and reducing the number of tanks to maintain, and the number of rectifiers needed for plating. In addition, potential separation issues between via fill plating and bridge plating are also reduced or eliminated.

The general steps of the process to manufacture a printed circuit board that provides improved heat dissipation include the following:

The initial step is to provide the PCB with various drilled through-hole arrays. Thus, the printed circuit board comprises a metallized panel with an array or arrangement of drilled through-holes. Through-holes, blind micro vias, and such can be formed by various methods, including, for example, mechanical drilling, laser drilling, plasma etching, or single or double shot.

Next, the through-holes are made conductive using a metallization technique as is generally known in the art. Various metallization techniques may be used including, for example, sputter coating, electroless copper, carbon-based direct metallization, graphite-based direct metallization, conductive polymers, palladium-based direct metallization, among others. Other metallization techniques would be known to those skilled in the art and would be usable in the process described herein. The primary metallization layer may be electroless copper, electrolytic copper flashing, or a direct metallization layer formed by carbon, graphite, or conductive polymer-based direct metallization.

In one embodiment, a conductive seed layer is formed on the non-conductive surface to initiate the electroplating of copper. The seed layer is electrically conductive, provides adhesion and permits the exposed portions of its upper surface to be electroplated. Examples of the conductive seed layer include, but are not limited to, metal layers such as copper or palladium that may be formed by electroless deposition, graphite, carbon, and conductive polymers.

The panel to be plated is preferably copper or a copper-coated substrate.

Next, the metallized panels are cleaned and activated using conventional pretreatment techniques such as acid or alkaline cleaning and acid dip or microetching with rinsing in between steps.

Thereafter, the panels are contacted with the acid copper electrolyte comprising a source of copper ions, sulfuric acid, halide ions, and specialized organic additives comprising suppressors, accelerators, and secondary suppressors. The acid copper electrolyte, in combination with a specialized rectification procedure as described herein, is capable of filling through-holes in the panel in a highly effective process. The aqueous acidic copper electrolyte can be used in conventional vertical or horizontal plating equipment. In contrast, as discussed above, prior art copper electroplating processes for plating through-holes can require a two-step process, including a first copper plating solution and plating conditions to close a hole and a second copper plating solution and plating conditions to fill the two blind vias thus formed.

In one embodiment, the plating cycle comprises (a) pulse plating for a first time period, wherein the pulse plating uses pulse reverse plating with a multiple-step pulse waveform on opposite sides of the electronic substrate, followed by (b) direct current plating using forward current for a second time period.

The source of copper ions in the acid copper electrolyte may be copper sulfate. The resistivity of the copper plating solution is greater when the concentration is increased. The solubility of copper sulfate decreases when the sulfuric acid concentration is increased. The concentration of copper sulfate in the acid copper electrolyte is typically maintained within the range of about 100 to about 300 g/L, more preferably about 180 to about 280 g/L, most preferably in the range of about 200 to about 250 g/L.

The principal function of sulfuric acid is to provide for maximum solution conductivity. Due to the high conductivity of the solution, the anode and cathode polarizations are small as is the voltage required for depositing copper. In addition, when very high cathode current densities are used, a higher concentration of copper sulfate is required within the recommended limits. Changes in sulfuric acid concentration have more influence than changes in copper sulfate concentration on anode and cathode polarization and on solution conductivity. The concentration of sulfuric acid in the acid copper electrolyte is typically maintained within the range of about 10 to about 150 g/L, more preferably about 60 to about 100 g/L.

The acid copper electrolyte also contains halide ions, most preferably chloride ions. Chloride ions enhance the adsorption and inhibition of the wetter. In addition, a small amount of chloride ions acts as binding sites for the polyglycols to the electrode surface. Chloride made be added in the form of sodium chloride or as diluted hydrochloric acid. Chloride ions in the acid copper electrolyte act to eliminate striated deposits in high current density areas. Chloride ions also affect the surface appearance, structure, micro-hardness, crystallographic orientation and internal stress of the deposits. Chloride ions are consumed by electrochemical/chemical changes during electrolysis, partial inclusion into the deposit, dragout loss, bath dilution, and anode maintenance. The concentration of chloride ions in the acid copper electrolyte is typically maintained within the range of about 20 to about 200 ppm, more preferably about 60 to about 150 ppm, most preferably within the range of about 70 to about 100 ppm.

The characteristics of copper deposits are influenced by various factors, including concentration of copper sulfate, free acid, additives, temperature, cathode current density and the nature and degree of agitation.

In one embodiment, the acid copper electrolyte works well in the absence of any iron ions, including ferric ions and ferrous ions. Thus, the acid copper electrolyte is preferably at least essentially free of both ferric ions and ferrous ions, and more preferably is free of both ferric ions and ferrous ions.

Fill-in behavior in the through-hole is influenced at least in part by controlling the deposition kinetics within the through-holes and on the horizontal portions and edges. This may be achieved by introducing certain organic additives into the acid copper electrolyte to influence the rate of copper ions that deposit on the respective locations. As discussed above, the organic additives include a combination of one or more accelerators, one or more suppressors, and/or one or more secondary suppressors.

Suitable accelerators incorporate organic compounds that contain sulfur and other functional groups and is responsible for the formation of small grain refined deposit. The accelerator also acts as a leveling agent. The accelerator is consumed by incorporation into the electrolytic deposit at the cathode or by oxidation onto the surface of the anode, especially if insoluble anodes are used. The accelerator can also be consumed by de-coupling in the presence of metallic copper, generating by-products, or by air oxidation, anode maintenance or by dragout loss/bath dilution.

Examples of suitable accelerators include one or more of 3-(benzothiazolyl-2-thio)-propyl sulfonic acid, sodium salt; 3-mercaptopropane-1-sulfonic acid, sodium salt; ethylene dithiodipropyl sulfonic acid, sodium salt; bis-(p-sulfophenyl)-disulfide, disodium salt; bis-(ω-sulfobutyl)-disulfide, disodium salt; bis-(ω-sulfohydroxypropyl)-disulfide, disodium salt; bis-(ω-sulfopropyl)-disulfide, disodium salt; bis-(ω-sulfopropyl)-sulfide, disodium salt; methyl-(ω-sulfopropyl)-disulfide, disodium salt; methyl-(ω-sulfopropyl)-trisulfide, disodium salt; O-ethyldithio-carbonic acid-S-(ω-sulfopropyl)-ester, potassium salt; thioglycolic acid; thiophosphoric acid-O-ethyl-bis-(ω-sulfopropyl)-ester, disodium salt; and thiophosphoric acid-(ω-sulfopropyl)-ester, trisodium salt. Other suitable sulfur-containing compounds and salts thereof would also be known to those skilled in the art and would be usable in the acid copper electrolyte described herein. In a preferred embodiment, the accelerator comprises bis-(ω-sulfopropyl)-sulfide or 3-mercaptopropane-1-sulfonic acid or a salt thereof.

The concentration of the one or more accelerators in the acid copper electrolyte is typically maintained in the range of about 0.1 to about 30 ppm, more preferably about 0.5 to about 20 ppm, most preferably within the range of about 4-10 ppm.

The suppressor comprises a high molecular weight organic compound, such as a polyglycol, having low solubility in the solution and a low coefficient of diffusion. The suppressor is adsorbed on the cathode surface, uniformly forming a diffusion layer that limits the transfer of accelerator and secondary suppressor. In the presence of chloride ions, the degree of adsorption and inhibition is further enhanced. In one embodiment, the molecular weight of the suppressor is at least about 300. More preferably, the molecular weight of the suppressor is between about 500 and about 5,000.

The suppressor may be consumed during electrolysis, in which reduction of molecular weight occurs, or may be consumed by partial inclusion into the deposit. As with the accelerator, the suppressor may be consumed by anode maintenance or by dragout loss/bath dilution.

Examples of suitable suppressors include one or more of carboxymethylcellulose, nonylphenolpolyglycolether, octandiol-bis-(polyalkylene glycol ether), octanol polyalkylene glycol ether, oleic acid polyglycol ester, polyethylene glycol polypropylene glycol copolymerisate, polyethylene glycol, polyethylene glycol dimethylether, polypropylene glycol, polyvinylalcohol, β-naphthyl polyglycol ether, stearic acid polyglycol ester, stearic acid alcohol polyglycolether, and copolymers of propylene glycol and ethylene glycol. Other suitable polyglycols and similar compounds would also be known to those skilled in the art and would be usable as the suppressor in the acid copper electrolyte. In one preferred embodiment, the wetter comprises copolymers of propylene glycol and ethylene glycol.

The concentration of the suppressor in the acid copper electrolyte is typically maintained in the range of about 0.1 to about 50 g/L, more preferably about 1 to about 10 g/L.

The secondary suppressor is typically a medium molecular weight organic compound containing key functional groups. In one embodiment, the secondary suppressor has a molecular weight of between about 300 and about 10,000, more preferably between about 500 and about 5,000. The secondary suppressor has low solubility in the solution and a low coefficient of diffusion and acts through selective adsorption on a readily accessible surface (i.e., flat surface and protruding high points). The secondary suppressor is consumed by electrochemical/chemical changes during the electrolysis, by partial inclusion in the deposit, by anode maintenance, and by dragout loss/bath dilution.

Examples of suitable secondary suppressors include polyamines, ethoxylated polyamines, polypyridine, polyimidazole, polyvinyl pyridine, polyvinyl imidazole, ethoxylated polyvinyl pyridine, and ethoxylated polyvinyl imidazole. In one preferred embodiment, the secondary suppressor comprises ethoxylated polyamines and/or polyvinyl pyridine.

The concentration of the secondary suppressor in the acid copper electrolyte is typically maintained in the range of about 0.001 to about 200 ppm, more preferably about 0.001 to about 100 ppm, most preferably about 0.001 to about 50 ppm.

Table 1 summarizes the ingredients of a typical copper electrolyte for use in the process described herein:

TABLE 1

| Typical Ingredients and Concentrations of Copper Electrolyte | |
|---|---|
| Ingredient | Concentration Range |
| Copper sulfate | 100-300 g/L |
| Sulfuric acid | 10-150 g/L |

TABLE 1-continued

Typical Ingredients and Concentrations of Copper Electrolyte

| Ingredient | Concentration Range |
|---|---|
| Chloride ions | 40-200 ppm |
| Accelerator | 4-10 ppm |
| Suppressor | 1-10 g/L |
| Secondary suppressor | 0.001-50 ppm |

The substrate may be contacted with the aqueous acid copper electrolyte by various means known in the art including, for example, immersion of the substrate into the bath, spraying, or use of other plating equipment. By using specialized pulse rectification, pulse wave forms are initially used that result in accelerated filling of the middle of the through-holes to create a "bridge" while minimizing the amount of surface copper plated, which can be accomplished in both horizontal and vertical systems. The optimized cycle described herein ensures that formation of the bridge occurs quickly and efficiently. By minimizing the amount of time to form the bridge, the amount of surface copper plated can also be minimized. This important in the IC substrate industry because less copper that is deposited and finally etched to define the circuitry results in better the line resolution capabilities. Since the trend is always to finer and finer circuitry, the ability to maximize trace resolution is an advantage of the process described herein. This is directly related to the amount of copper that needs to be finally etched at the end. In other words, better resolution means capabilities for finer lines and tighter spacing.

As the center of the through-hole closes, the wave form is transitioned to straight DC current in the same acid copper electrolyte. The result is a continuous plating of the through-hole until it is completely filled.

The use of a multi-step waveform as described herein can produce good results as compared with waveforms of the prior art. While various waveforms have been developed that utilize forward (cathodic) pulses of certain duration and intensity interspersed with reverse (anodic) pulses of certain duration and intensity, the waveform described herein is a multi-step waveform that in one embodiment includes pulses of higher intensity during the pulse duration of the forward pulse.

In one embodiment, the waveform includes a repeatable sequence, the repeatable sequence comprising a set of pulse plating periods, the set of pulse plating periods including, in any order:

(i) first forward pulse period(s);
(ii) first reverse pulse period(s);
(iii) second forward pulse period(s); and
(iv) rest period.

In one embodiment, the set of forward pulses and reverse pulses has a duration of about one second, more preferably the set of forward pulses and reverse pulses has a duration of exactly one second. In another embodiment, the set of forward pulses and reverse pulses may have a duration of between about 0.5 and about 5 seconds, so long as the proportion of the duration of the pulses remains substantially the same. The duration of the set of forward and reverse pulses could be further defined and calculated as would be known to those skilled in the art.

In one embodiment, the duration of the first forward pulse period is substantially the same as the duration of the second forward pulse period. More preferably, the duration of the first forward pulse period is the same as the duration of the second forward pulse period. In addition, the intensity of the pulse of the forward pulse period is preferably at least substantially the same as the intensity of the pulse of the second forward pulse period, except for a time period of a high intensity pulse within at least one, and preferably each of the first forward pulse period and the second forward pulse period as further explained below.

In addition, at least one of the first forward pulse period and second forward pulse period (more preferably each of the first forward pulse period and the second forward pulse period) comprise a higher intensity pulse of a shorter duration within the first forward pulse period and/or the second forward pulse period. If the each of the first forward pulse and the second forward pulse comprise a high intensity pulse of a shorter duration, the higher intensity pulse of the shorter duration within each of the first forward pulse period and the second forward pulse period of the sequence may have the same intensity or may each have a different intensity. The intensity of the high intensity pulse within the first forward pulse period (otherwise known as the first high intensity pulse) and the intensity of the high intensity pulse within the second forward pulse period (otherwise known as the second high intensity pulse) also each have an intensity that is higher than the intensity of the first forward pulse period and the second forward pulse period. For example, the intensity of the first higher intensity pulse and the second high intensity pulse may be in the range of 100% to 500% of the intensity of the first forward pulse or the second forward pulse. In one embodiment the first high intensity pulse has an intensity that is 100-300% higher than the intensity of the first forward pulse and the second high intensity pulse has an intensity that is 100% to 300% higher than the intensity of the second forward pulse. In another preferred embodiment, the intensity of the second high intensity pulse is higher than the intensity of the first high intensity pulse.

It is further contemplated that the higher intensity pulse of a shorter duration may occur at the beginning, middle or end of the first forward pulse and/or second forward pulse. If the higher intensity pulse occurs at the beginning of the first forward pulse and/or the second forward pulse, the effect is that the pulse "steps down" from the higher intensity pulse. On the other hand, if the higher intensity pulse occurs at the end of the first forward pulse and/or the second forward pulse, the effect is that the pulse "steps up" to the higher intensity pulse.

The higher intensity pulse has a duration that is shorter than the duration of the first forward pulse and the second forward pulse. In one embodiment, the duration of the first high intensity pulse and the second high intensity pulse is each approximately 30-40% of the duration of the first forward pulse or the second forward pulse. For example, each of the first forward pulse period and the second forward pulse period may have a duration of about 50 to about 300 ms, more preferably about 100 to about 200 ms, most preferably about 100 to about 170 ms. For example, within the first forward pulse and/or the second forward pulse, the higher intensity pulse may have a duration of between about 20 ms to about 200 ms. More particularly, for a forward pulse having a duration of about 100 to about 170 ms, the higher intensity pulse may have a duration of about 30 to about 60 ms, depending on the particular application.

In addition, the duration of the reverse pulse period is preferably within the range of about 50 to about 150 ms, more preferably about 90 to about 140 ms, more preferably about 100 to about 130 ms, most preferably within the range of about 110 to about 120 ms.

The duration of the rest period is preferably within the range of about 50 to about 150 ms, more preferably about 80 to about 130 ms, most preferably within the range of about 110 to about 120 ms.

FIG. 1 depicts the steps of through-hole plating of copper in accordance with the present invention.

As set forth in FIG. 1, through-holes are drilled or otherwise formed in the circuit board. A primary metalliza-tion step such as electroless copper or direct metallization is performed after drilling to render the laminate surface within the through-hole and/or blind micro-via conductive. Option-ally, the primary metallization layer may be flash plated with a thin layer of copper to increase conductivity and increase robustness. Next, pulse plating is initiated to accelerate filling of the middle of the through-holes while minimizing the amount of surface copper plating. Next, as pulse plating is completed, the center of the through-hole closes, and the waveform is thereafter transitioned to DC current in the same acid copper plating solution to plate the through-hole until it is completely metallized.

The process described herein can be used for metallizing a substrate having a thickness of between 0.005 and about 3 mm, more preferably between about 0.01 and about 1.0 mm, most preferably between about 0.05 to about 0.5 mm. Through-hole diameters generally range from about 0.005 and about 1 mm, preferably about 0.01 to about 0.8 mm, most preferably about 0.075 to about 0.25 mm. Thus, the process described herein is suitable for metallizing through-holes having an aspect ratio of between about 0.5:1 and about 6:1, more preferably between about 0.5:1 and about 4:1, most preferably between about 0.5:1 and about 3:1.

The electrolytic plating of through-holes described herein combines pulse plating and direct current plating in a prescribed manner to achieve complete filling of the through-holes in a single-step, single bath plating process.

Table 2 depicts an example of the process parameters for direct current and pulse plating current.

TABLE 2

Process Parameters for Direct Current and Pulse Plating

| Type of current | Parameter | Ranges |
|---|---|---|
| Direct Current | Forward current | 0.5 to 7.0 ASD |
| Pulse Plating | Forward current | 0.5 to 9.0 ASD |
| | Single or multi-step | 50% to 300% forward current |
| | Reverse current | Up to 4x forward current density |
| | Frequency | 0.5 to 5.0 Hz |
| | Forward pulse period | 200-400 ms |
| | Reverse pulse period | 50-250 ms |
| | Dead time | Up to 160 milliseconds |

Table 3 describes an example of the steps in the process, including current density and cycle times that have been determined to produce a good result. It is noted that Step 1 is an optional step in the process and the process can be performed with only Steps 2 and 3. In another embodiment, Step 2A is included as an optional step to be performed between Steps 2 and 3 as further explained below.

TABLE 3

| Steps in plating process | | | |
|---|---|---|---|
| Step Number | Current Mode | Current Density (ASD) | Cycle time (min) |
| 1 | Direct Current | 2.5 | 1-10 |
| 2 | Pulse Current | 1.5-3.5 (base) | 5-180 |
| 2A | Synchronous Pulse Current | 1.5-3.5 (base) | 30-80 |
| 3 | Direct Current | 0.5-3.5 | 5-180 |

As described herein, the process uses a special type of metallization by means of a pulse reverse current. In one embodiment, the repeatable sequence comprising the set of pulse plating periods applied to a first side of the substrate is the same as the repeatable sequence applied to the second side of the substrate. In another embodiment, the repeatable sequence applied to the first side of the substrate is the same as the repeatable sequence applied to the second side of the substrate, except done in reverse order. In another embodi-ment, the repeatable sequence applied to the second side of the substrate is different from the repeatable sequence applied to the first side of the board. Thus, while the set of pulse plating periods on the second side of the substrate may be aligned, for example, so that the first high intensity pulse on a first side of the substrate coincides with the rest period on the second side of the substrate, the first high intensity pulse and the second high intensity pulse on the second side of the substrate may be of different intensities than the intensities of the first high intensity pulse and the second high intensity pulse on the first side of the substrate even if the pulses themselves are of the substantially the same or exactly the same duration.

By means of the two rectifiers, the two sides of a printed circuit board can be individually metallized. Furthermore, each of the rectifiers can be separately programmed by means of one or more microcontrollers to input the repeat-able sequences for the first side and the second side of the substrate.

In still another embodiment, the repeatable sequence may comprise a plurality of two or more or even three or more repeatable sequences arranged in a repeating series. What is important is that each repeatable sequence has the same frequency period, which may be within a range of about 0.5 to 5 seconds, more preferably about 1 second, and most preferably exactly one second, while the duration of the first forward pulse(s), second forward pulse(s), reverse pulse(s) and rest period within the set of pulse plating periods that comprise the sequence(s) may be varied.

In another embodiment, the durations of the first forward pulse period(s), reverse pulse period(s), second forward pulse period(s), and rest period are varied as the plating cycle proceeds. In addition, the amplitude and/or peak current densities of the first forward pulse period(s), reverse pulse period(s), second forward pulse period(s) and rest period along with the first high intensity pulse and the second high intensity pulse can be varied as the plating cycle proceeds.

It is further contemplated that these changes in the set of pulse plating periods may be made independently on the first and second sides of the substrate. That is, if undesirable plating properties are observed (i.e., bridging is not at the center of the through-hole, voids are observed, etc.), the set of pulse plating periods may be modified to correct the deficiencies and the corrections may be made on the first side of the substrate and/or the second side of the substrates and the modifications may be the same or different on opposite sides of the substrate to achieve the results.

That is, depending on a thickness of the substrate and/or the diameter of the through-holes, it may be desirable to start the plating cycle at a higher current density and as the plating cycle proceeds, sequentially reduce or increase the current density to achieve more efficient through-hole plating.

Figure 2:
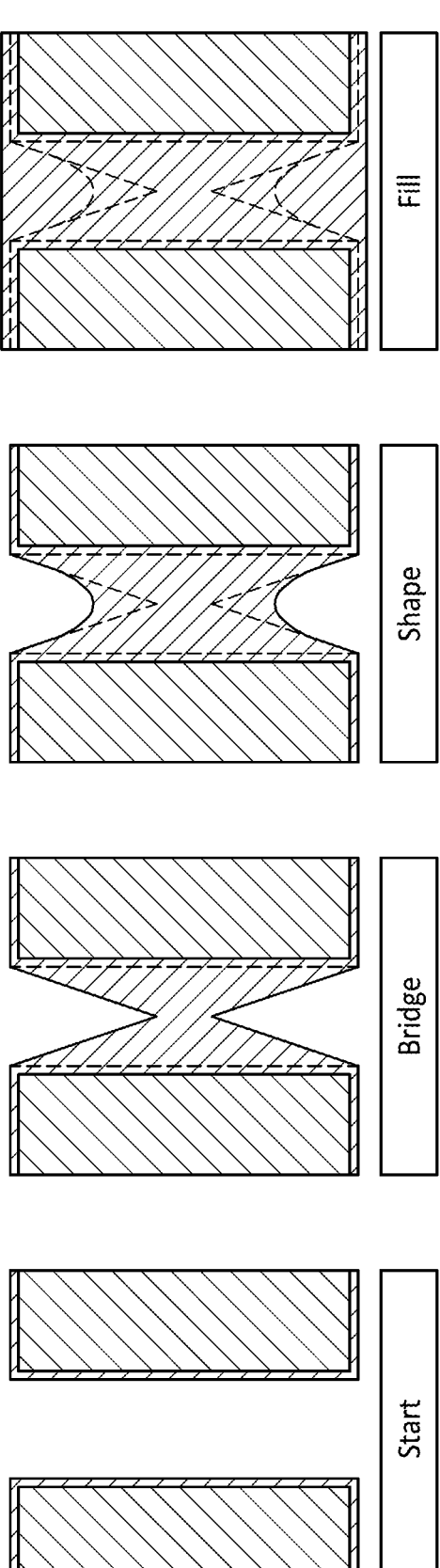
FIG. 2 depicts the steps of through-hole plating of copper in accordance with one aspect of the present invention in which an optional shaping step is included.

In still another embodiment, a first pulse plating cycle is performed as outlined above, which pulse plating cycle may be an asynchronous plating cycle in which the repeatable sequence on the first side of the substrate is the same as the repeatable sequence on the second side of the substrate, except in reverse order. Thereafter a second pulse plating cycle may be performed to shape the copper bridge formed in the first plating cycle as illustrated in FIG. 2. This second pulse plating cycle may be a regular pulse plating cycle with synchronous waveforms on the first and second side of the substrate.

If this second pulse plating cycle is used, the regular pulse plating cycle uses a forward/reverse current ratio of 1:1 to 1:4, more preferably about 1:2. The forward plating pulse is in a range of 10-200 ms and the reverse plating pulse is in the range of about 0.5 to about 10 ms. Plating is performed for about 20 minutes to about 3 hours, more preferably about 30 minutes to about 90 minutes, more preferably about 30 to 45 minutes to shape the copper bridge. This pulse plating cycle can be used, for example, when plating through-holes having a small diameter (which, for example, may be 0.2 mm or less) where there is a tendency to form V-shaped blind vias. In this instance, the bridging creates a V-shape that is very deep, which is difficult to plate using direct plating without any dimples or voids as illustrated in FIG. 2.

Thus, the second pulse plating cycle is used to shape the bridge from the deep-V shape to a U shape. The transition from the first pulse plating cycle utilizing an asynchronous waveform to the second plating cycle utilizing a synchronous waveform helps to shape the copper bridge to allow for more uniform plating of the through-holes without any dimples or voids. Monitoring may be performed by observing and adjusting the cycle during the initial design/set up phase. In one embodiment, the second plating cycle is built into the cycle as an element of time and depending on the diameter of the through-holes being plated.

In one embodiment, the process includes a step of monitoring certain parameters of the through-hole filling and modifying the time periods of one or more of the steps in the plating sequence or modifying the amplitude/peak current density if inadequate through-hole plating is observed and/or if the certain parameters are outside of acceptable values.

The peak current density of the at least one forward current pulse at the work-piece is preferably adjusted to 15 $A/dm^2$ at most. Particularly preferable is a peak current density of the at least one forward current pulse at the workpiece of about 5 $A/dm^2$.

The peak current density of the at least one reverse current pulse at the work piece will preferably be adjusted to a value of no more than 60 $A/dm^2$. Particularly preferred is a peak current density of the at least one reverse current pulse at the workpiece of about 20 $A/dm^2$.

In the further progress of the metallization process at least one parameter of the pulse reverse current can be varied, wherein this parameter is chosen from a group comprising the ratio of the duration of the forward current pulse to the duration of the reverse current pulse and the ratio of the peak current density of the forward current pulse to the peak current density of the reverse current pulse. It has been proven to be particularly advantageous to increase the ratio of the peak current density of the forward current pulse to the peak current density of the reverse current pulse when metallizing the workpiece and/or to decrease the ratio of the duration of the forward current pulse to the duration of the reverse current pulse as further explained above.

As described herein, the aqueous acidic copper electrolyte can be used in conventional vertical or horizontal plating equipment. The plating system can be designed as a vertical hoist. VCP, or horizontal system with inert or soluble anodes. In a preferred embodiment, the system is a vertical system with inert anodes.

Examples of suitable anode materials include iridium oxide coating on titanium mesh or mixed metal oxide coated anodes. Other suitable anode materials would also be known to those skilled in the art. The anode is also optionally, but preferably, shielded to optimize macrodistribution.

In one embodiment, the anode material is iridium oxide/tantalum oxide coated titanium. One suitable anode is available from De Nora S.p.A under the tradename De Nora DT. Other suitable anode materials would be known to those skilled in the art and are also usable.

The substrate or at least a portion of its surface may be contacted with the aqueous acid coper plating solution by various methods, including spraying, wiping, dipping, immersing, or by other suitable means.

The process described herein also preferably includes cleaning, etching, reducing, rinsing and/or drying steps as is generally known in the art.

The acid copper electrolyte described herein is equipped with a solution manifold system comprising an array of nozzles for providing direct solution impingement against the panel. Nozzles on either side of the panel are directly aligned with each other and, with the pumps, are capable of solution flows of 0 to 5.0 L/min/nozzle.

Plating can be done in panel, pattern, or button plating mode as is generally known to those skilled in the art.

After plating, the panels can be used as is or the panels can be run through typical processes such as planarization or copper reduction or further layers can be built up where additional blind micro-vias may be stacked on the copper filled through-holes.

Figure 3:
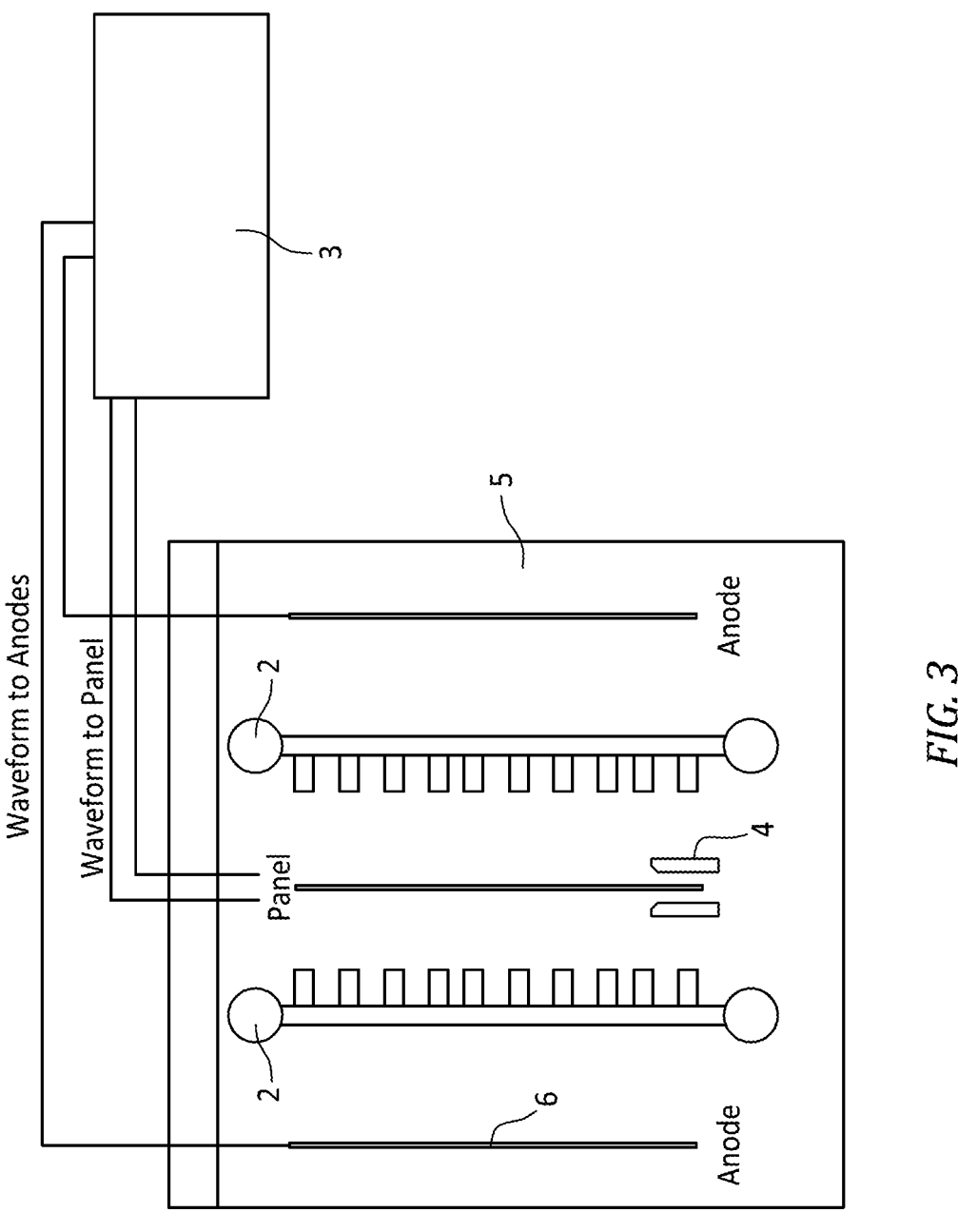
FIG. 3 depicts an apparatus in one embodiment of the present invention.

In one embodiment, and as shown in FIG. 3, the apparatus includes:

A) a plating tank 5 in which the acid copper electrolyte is maintained;

B) a solution delivery system (not shown) comprising a dual box manifold or a vertical pipe manifold;

C) an array of eductor nozzles 2 or cone nozzles arranged to simultaneously impinge both sides of a circuit board immersed in the plating tank 5;

D) a plating rack 4 for securing the PCBs; and

E) an electroplating power supply rectifier 3 or plurality of rectifiers, each capable of direct current and pulse reverse plating connected to suitable control means, which may include one or more microcontrollers.

In one embodiment, the apparatus may comprise standard vertical hoist or automatic plating equipment. In another embodiment, the apparatus may comprise horizontal plating equipment. However, vertical plating equipment is preferred.

The plating tank preferably comprises a temperature controller to regulate heating and cooling, which is connected to a heating and cooling system that is capable of maintaining the acid copper electrolyte at the desirable bath temperature+/−1.5° C. In a preferred embodiment, the electrolyte is maintained at a temperature of between about 10 and about 50° ° C., more preferably between about 15 and about 45° C., more preferably between about 20 and about 30° C. most preferably at a temperature of between about 22 and about 25° C.

The acid copper electrolyte is optionally, but preferably, agitated. In one embodiment, a clean air agitation sparge dual pipe may be aligned underneath the cathode. Agitation may also be accomplished by mechanical movement of the bath such as by shaking, stirring, or continuous pumping of the electrolyte solution, or by ultrasonic treatment, elevated temperature, or gas feeds, such as purging with air or an inert gas (i.e., argon or nitrogen). Other means of agitation would also be known to those skilled in the art.

The anode to cathode ratio is preferably targeted at greater than 1:0.75, and may be up to 1:2, preferably about 1:1. What is important is to have enough surface area to even the current distribution across the entire PCB.

The plating tank is also preferably equipped with an automatic copper oxide replenishment system to maintain the concentration of copper sulfate to within a desired level.

rectifier(s) is/are programmable with 8 steps which define a single set of pulse plating periods as further explained herein, which 8 steps may include, for example:

1) a first pulse of a first forward duration and first forward intensity;
2) a second pulse of a second forward duration and second forward intensity;
3) a third pulse of the first forward duration and first forward intensity;
4) a fourth pulse of a reverse duration and reverse intensity;
5) a fifth pulse of the first forward duration and first forward intensity;
6) a sixth pulse of a third forward duration and third forward intensity;
7) a seventh pulse of the first forward duration and first forward intensity; and
8) a rest period.

Table 4 sets forth an example of a pulse plating cycle having 8 steps in accordance with the present invention.

TABLE 4

| | Pulse plating cycle. | | | | | | | |
|---|---|---|---|---|---|---|---|---|
| (4 ASD) | Step 1 | Step 2 | Step 3 | Step 4 | Step 5 | Step 6 | Step 7 | Step 8 |
| Side 1 (%*) | 100-130 | 230-300 | 100-130 | (−290)-(−370) | 100-130 | 130-180 | 100-130 | 0 |
| Side 1 (ms) | 80-250 | 80-250 | 80-250 | 80-250 | 80-250 | 80-250 | 80-250 | 80-250 |
| Side 2 (%*) | 100-130 | 0 | 100-130 | 130-180 | 100-130 | (−290)-(−370) | 100-130 | 230-300 |
| Side 2 (ms) | 80-250 | 80-250 | 80-250 | 80-250 | 80-250 | 80-250 | 80-250 | 80-250 |

*% describes the value as a percent of base current density

In addition, the apparatus also preferably includes a copper oxide mixing tank and a copper oxide feeder for introducing copper oxide into the replenishment system. The plating tank also includes means for replenishing other ingredients of the acid copper electrolyte and for monitoring the concentration of the ingredients.

The electroplating racks may be coated stainless steel or may be partially or non-coated plating racks. Optionally, the electroplating racks may comprise a coated copper core.

The copper electroplating tank is also preferably outfitted with a continuous solution filtration system that is capable of filtering particle of about 1 micron or more and that is designed to handle at least 3 solution turnovers per hour, preferably at least 4 solution turnovers per hour and more preferably at least 5 solution turnovers per hour.

The apparatus also preferably includes a controller capable of managing heating, cooling, and chemical additions with the plating tank.

Finally, it is also highly desirable that the copper electroplating apparatus be outfitted with a ventilation system as would generally be known to those skilled in the art.

The electroplating power supply rectifier 3 is configured to handle both direct current and pulse reverse current. The rectifier may be water or air cooled. The rectifier may comprise a single rectifier or may comprise a first rectifier for a first side of the substrate and a second rectifier for the second side of the substrate, each of which is programmable with a multistep capability.

In one embodiment, the rectifier(s) is/are programmable with multiple steps, including at least 4 steps or least 6 steps or even up to 12 steps. In one preferred embodiment, the As discussed above, as the center of the through-hole bridges or closes, the wave form is transitioned to straight DC current in the same acid copper electrolyte. The result is a continuous plating of the through-hole until it is completely filled. Thus, the rectifier(s) is/are programmed to transition the pulse reverse waveform used for bridging to direct current and to continue plating until the through-holes are completely filled.

The box manifold/vertical pipes are designed to include the array of eductor nozzles or cone nozzles. Opposing nozzles are designed front to back side. The nozzles are preferably arranged in a staggered pattern and may be arranged about 2 to about 8 cm apart, more preferably about 3 to about 6 cm apart, most preferably about 4 to about 5 cm apart in both horizontal and vertical direction.

The process further explained by means of the following examples:

Examples 1

An acid copper electrolyte was made up according to the following parameters:

| Ingredient | Make Up |
|---|---|
| Copper sulfate | 240 g/L |
| Sulfuric acid | 90 g/L |
| Chloride ions | 80 ppm |
| Accelerator | 0.85 mL/L |

-continued

| Ingredient | Make Up |
|---|---|
| Suppressor | 10 mL/L |
| Secondary suppressor | 2 mL/L |
| Bath Temperature | 23° C. |

The concentration of copper sulfate was maintained with the addition of copper oxide, on either a manual or automatic basis, based on Amp hours of operation and/or with chemical titration analysis.

The concentration of sulfuric acid and chloride ions was replenished based on chemical titration analysis.

Replenishment of the accelerator, suppressor, and secondary suppressor was accomplished with an automatic dosing system, based on Amp hours of operation and/or cyclic voltammetric stripping (CVS) analysis.

A flash plating layer was deposited by DC plating at a current density of 2 ASD for a period of 10 minutes. Thereafter, pulse reverse plating was performed at a current density of 2.4 ASD for a period of 60 minutes to create a copper bridge in the through-holes, followed by DC plating at a current density of 2.5 ASD for a period of 60 minutes until the through-holes were filled in a vertical plating process.

The pulse plating waveform on a first side and a second side of the substrate followed a sequence of:

| | Side A | | | Side B | |
|---|---|---|---|---|---|
| Step | Duration (ms) | Amplitude (%) | Step | Duration (ms) | Amplitude (%) |
| Step 1 | 120 | 110 | Step 1 | 120 | 110 |
| Step 2 | 120 | 260 | Step 2 | 120 | 0 |
| Step 3 | 140 | 110 | Step 3 | 140 | 110 |
| Step 4 | 120 | −330 | Step 4 | 120 | 150 |
| Step 5 | 120 | 110 | Step 5 | 120 | 110 |
| Step 6 | 120 | 150 | Step 6 | 120 | −330 |
| Step 7 | 140 | 110 | Step 7 | 140 | 110 |
| Step 8 | 120 | 0 | Step 8 | 120 | 260 |

An observation of a cross-section of the plated circuit board showed good plating with no dimple.

Example 2

An acid copper electrolyte was made up as in Example 1.

A flash plating layer was deposited by DC plating at a current density of 2 ASD for a period of 10 minutes. Thereafter, pulse reverse plating was performed at a current density of 3.0 ASD for a period of 45 minutes to create a copper bridge in the through-holes, followed by DC plating at a current density of 2.0 ASD for 90 minutes until the through-holes were filled in a vertical plating process.

The pulse plating waveform on a first side and a second side of the substrate followed a sequence of:

| | Side A | | | Side B | |
|---|---|---|---|---|---|
| Step | Duration (ms) | Amplitude (%) | Step | Duration (ms) | Amplitude (%) |
| Step 1 | 125 | 120 | Step 1 | 125 | 120 |
| Step 2 | 125 | 260 | Step 2 | 125 | 0 |
| Step 3 | 125 | 120 | Step 3 | 125 | 120 |
| Step 4 | 125 | −330 | Step 4 | 125 | 150 |

-continued

| | Side A | | | Side B | |
|---|---|---|---|---|---|
| Step | Duration (ms) | Amplitude (%) | Step | Duration (ms) | Amplitude (%) |
| Step 5 | 125 | 120 | Step 5 | 125 | 120 |
| Step 6 | 125 | 150 | Step 6 | 125 | −330 |
| Step 7 | 125 | 120 | Step 7 | 125 | 120 |
| Step 8 | 125 | 0 | Step 8 | 125 | 260 |

An observation of a cross-section of the plated circuit board showed good plating with no dimple.

Example 3

An acid copper electrolyte was made up according to the following parameters:

| Ingredient | Make Up |
|---|---|
| Copper sulfate | 240 g/L |
| Sulfuric acid | 90 g/L |
| Chloride ions | 80 ppm |
| Accelerator | 0.85 mL/L |
| Suppressor | 10 mL/L |
| Secondary suppressor | 2 mL/L |
| Bath Temperature | 23° C. |

A flash plating layer was deposited by DC plating at a current density of 2 ASD for a period of 10 minutes. Thereafter, pulse reverse plating was performed at a current density of 2.4 ASD for a period of 40 minutes to create a copper bridge in the through-holes. Thereafter synchronous pulse plating was performed at a current density of 2.7 ASD for a period of 40 minutes to shape the bridge, followed by DC plating at a current density of 2.5 ASD for a period of 60 minutes until the through-holes were filled in a vertical plating process.

The pulse plating waveform on a first side and a second side of the substrate in the bridging step followed a sequence of:

| | Side A | | | Side B | |
|---|---|---|---|---|---|
| Step | Duration (ms) | Amplitude (%) | Step | Duration (ms) | Amplitude (%) |
| Step 1 | 120 | 110 | Step 1 | 120 | 110 |
| Step 2 | 120 | 260 | Step 2 | 120 | 0 |
| Step 3 | 140 | 110 | Step 3 | 140 | 110 |
| Step 4 | 120 | −330 | Step 4 | 120 | 150 |
| Step 5 | 120 | 110 | Step 5 | 120 | 110 |
| Step 6 | 120 | 150 | Step 6 | 120 | −330 |
| Step 7 | 140 | 110 | Step 7 | 140 | 110 |
| Step 8 | 120 | 0 | Step 8 | 120 | 260 |

The synchronous pulse plating in the shaping step had the following parameters:

| Parameter | Value |
|---|---|
| Reverse/Forward Ratio | 2:1 |
| Forward Time | 100 ms |
| Reverse Time | 5 ms |

An observation of a cross-section of the plated circuit board showed good plating with no dimple when plating high aspect ratio through-holes.

Example 4

An acid copper electrolyte was made up as in Example 3.

A flash plating layer was deposited by DC plating at a current density of 2 ASD for a period of 10 minutes. Thereafter, pulse reverse plating was performed at a current density of 2.4 ASD for a period of 40 minutes to create a copper bridge in the through-holes. Thereafter synchronous pulse plating was performed at a current density of 2.7 ASD for a period of 40 minutes to shape the bridge, followed by DC plating at a current density of 2.5 ASD for a period of 60 minutes until the through-holes were filled in a vertical plating process.

The pulse plating waveform on a first side and a second side of the substrate followed a sequence of:

| | Side A | | | Side B | |
|---|---|---|---|---|---|
| Step | Duration (ms) | Amplitude (%) | Step | Duration (ms) | Amplitude (%) |
| Step 1 | 110 | 110 | Step 1 | 110 | 110 |
| Step 2 | 110 | 260 | Step 2 | 110 | 0 |
| Step 3 | 110 | 110 | Step 3 | 110 | 110 |
| Step 4 | 170 | −330 | Step 4 | 170 | 150 |
| Step 5 | 110 | 110 | Step 5 | 110 | 110 |
| Step 6 | 170 | 150 | Step 6 | 170 | −330 |
| Step 7 | 110 | 110 | Step 7 | 110 | 110 |
| Step 8 | 110 | 0 | Step 8 | 110 | 260 |

The synchronous pulse plating in the shaping step had the following parameters:

| Parameter | Value |
|---|---|
| Reverse/Forward Ratio | 2:1 |
| Forward Time | 100 ms |
| Reverse Time | 5 ms |

An observation of a cross-section of the plated circuit board showed good plating with no dimple when plating high aspect ratio through-holes.

Thus, it can be seen that the process described herein allows for the metallization of through-holes and/or blind micro-vias that do not exhibit any defects, such as unacceptable voids, cavities, or excessive dimples.

What is claimed is:

1. A method of plating a metal on an electronic substrate, wherein the electronic substrate comprises one or more features, wherein the one or more features comprise one of one or more through-holes and/or one or more micro-vias in the electronic substrate, the method comprising the steps of:
  a) preparing the electronic substrate to receive metal plating thereon;
  b) bringing the electronic substrate and at least one counter electrode into contact with a copper electroplating bath comprising a source of copper ions to be plated;
  c) electrically polarizing first and second sides of the electronic substrate to initiate metal plating thereon, wherein the copper electroplating bath plates the one or more through-holes and/or the one or more micro-vias using a plating cycle until metallization is complete; wherein the plating cycle comprising the steps of, in order:
    1) Pulse plating for a first time period on a first side and a second side of the electronic substrate to cause copper to preferentially plate in the center of the one or more through-holes, wherein the copper merges together in the center of the one or more through-holes to form two opposing blind vias; and
    2) Direct plating for a second time period to fill the two opposing blind vias formed by pulse plating;
  wherein the pulse plating step comprises applying an electrical current to electrodeposit metal from the copper electroplating bath to the first side and second side of the electronic substrate, wherein the electrical current is applied as a pulse plating cycle comprising a repeatable sequence, wherein the repeatable sequence comprises a set of pulse plating periods, wherein the set of pulse plating periods includes a set of steps, the set of steps including, in any order:
    (i) a first pulse of a first forward duration and first forward intensity;
    (ii) a second pulse of a second forward duration and second forward intensity;
    (iii) a third pulse of the first forward duration and first forward intensity;
    (iv) a fourth pulse of a reverse duration and reverse intensity;
    (v) a fifth pulse of the first forward duration and first forward intensity;
    (vi) a sixth pulse of a third forward duration and third forward intensity;
    (vii) a seventh pulse of the first forward duration and first forward intensity; and
    (viii) a rest period within the set of pulse plating periods;
  wherein the duration of the rest period is between 50 and 150 ms.

2. The method according to claim 1, wherein the step of preparing the electronic substrate to accept electroplating thereon comprises the step of cleaning the electronic substrate prior to metallizing the one or more through-holes and/or one or more micro-vias.

3. The method according to claim 2, further comprising the step of microetching the cleaned electronic substrate.

4. The method according to claim 1, wherein the metallized electroplated copper deposit completely fills the one or more through-holes and/or the one or more blind micro-vias and deposits a conformal copper deposit on the electronic substrate.

5. The method according to claim 1, wherein the copper electroplating bath is maintained at a temperature of between about 10 and about 50° C.

6. The method according to claim 1, further comprising the step of direct current plating using forward current for a time period prior to step 1) to deposit a flash copper layer on the surfaces of the one or more through-holes and/or one or more blind micro-vias.

7. The method according to claim 1, wherein the electronic substrate is contacted with the copper electroplating bath by immersing the electronic substrate in the copper electroplating bath.

8. The method according to claim 1, wherein the pulse plating cycle comprising the repeatable sequence applied to the first side of the electronic substrate is the same as the pulse plating cycle comprising the repeatable sequence applied to the second side of the electronic substrate.

9. The method according to claim 1, wherein the pulse plating cycle comprising the repeatable sequence applied to the first side of the electronic substrate is different from the pulse plating cycle comprising the repeatable sequence applied to the second side of the electronic substrate.

10. The method according to claim 1, wherein each set of pulse plating periods has a duration of between about 0.5 and about 5 seconds.

11. The method according to claim 10, wherein each set of pulse plating periods has a duration of 1 second.

12. The method according to claim 1, wherein the sequence comprises a plurality of two or more repeatable sequences arranged in a repeating series.

13. The method according to claim 9, wherein the pulse plating cycle is an asynchronous plating cycle, wherein the repeatable sequence applied to the first side of the electronic substrate is the same as the repeatable sequence applied to the second side of the electronic substrate, except in reverse order.

14. The method according to claim 13, wherein after the asynchronous plating cycle is performed for a period of time, a second pulse plating cycle with synchronous waveforms on the first side and the second side of the electronic substrate is applied;

wherein the asynchronous plating cycle preferentially plates the copper in the center of the one or more through-holes such that the copper merges together in the center of the one or more through-holes to form two opposing blind vias and the second pulse plating cycle shapes the thus formed two opposing blind vias.

15. The method according to claim 14, wherein the second pulse plating cycle uses a forward/reverse current ratio of between about 1:1 to 1:4 and wherein the duration of forward pulses is in the range of about 10 to 200 ms and the duration of the reverse pulses is in the range of about 0.5 to 10 ms.

16. The method according to claim 1, wherein the duration of each forward pulse period is independently in the range of about 80 to 250 ms, the duration of the reverse pulse period is in the range of about 50 to about 150 ms, and the duration of the rest period is in the range of about 80 to about 130 ms.

17. The method according to claim 1, wherein at least one of the pulses of the first forward duration and the first forward intensity or the pulse of the second forward duration and second forward intensity comprises a higher intensity pulse of a shorter duration within the first forward duration or the second forward duration, wherein the higher intensity pulse has an intensity that is about 100% to about 500% of the intensity of the first forward intensity or the second forward intensity.

18. An electronic substrate comprising one or more features metallized by the process of claim 1.

19. An electronic substrate comprising one or more features metallized by the process of claim 14.

20. A method of metallizing an electronic substrate comprising one or more high aspect ratio through-holes, the method comprising the steps of:

a) preparing the electronic substrate to receive metal plating thereon;

b) bringing the electronic substrate and at least one counter electrode into contact with an acid copper electroplating bath comprising a source of copper ions to be plated;

c) electrically polarizing first and second sides of the electronic substrate to initiate metal plating thereon, wherein the acid copper electroplating bath plates the one or more high aspect ratio through-holes using a plating cycle until metallization is complete; wherein the plating cycle comprising the steps of, in order:

1) Asynchronous pulse plating for a first time period on a first side and a second side of the electronic substrate to cause copper to preferentially plate in the center of the one or more high aspect ratio through-holes, wherein the copper merges together in the center of the one or more high aspect ratio through-holes to form two opposing blind vias;

2) Synchronous pulse plating for a second time period to shape the two opposing blind vias formed in the center of the through-holes; and 3) Direct plating for a third time period to fill the two opposing blind vias;

wherein the asynchronous pulse plating step comprises applying an electrical current to electrodeposit metal from the acid copper electroplating bath to the first side and second side of the electronic substrate, wherein the electrical current is applied as a pulse plating cycle comprising a repeatable sequence, the repeatable sequence comprising a set of pulse plating periods, each set of pulse plating periods including, in any order:

(i) at least a first pulse of a first forward duration and first forward intensity;

(ii) at least a second pulse of a reverse duration and reverse intensity;

(iii) at least a third pulse of a second forward duration and second forward intensity; and (iv) at least a rest period.

21. A method of plating a metal on an electronic substrate, wherein the electronic substrate comprises one or more features, wherein the one or more features comprise one of one or more through-holes and/or one or more micro-vias in the electronic substrate, the method comprising the steps of:

a) preparing the electronic substrate to receive metal plating thereon;

b) bringing the electronic substrate and at least one counter electrode into contact with a copper electroplating bath comprising a source of copper ions to be plated;

c) electrically polarizing first and second sides of the electronic substrate to initiate metal plating thereon, wherein the copper electroplating bath plates the one or more through-holes and/or the one or more micro-vias using a plating cycle until metallization is complete;

wherein the plating cycle comprises the steps of, in order:

1) Pulse plating for a first time period on a first side and second side of the electronic substrate to cause copper to preferentially plate in the center of the one or more through-holes, wherein the copper merges together in the center of the one or more through-holes to form two opposing blind vias;

2) Pulse plating for a second time period using synchronous waveforms to shape the thus formed two opposing blind vias; and 3) Direct plating for a third time period to fill the two opposing blind vias; wherein the pulse plating step comprises applying an electrical current to electrodeposit metal from the copper electroplating bath to the first side and second side of the electronic substrate, wherein the electrical current is applied as a pulse plating cycle comprising a repeatable sequence, wherein the repeatable sequence comprises a set of pulse plating periods, each set of pulse plating periods including, in any order:

(i) at least a first pulse of a first forward duration and first forward intensity;

(ii) At least a second pulse of a reverse duration and reverse intensity;

(iii) at least a third pulse of a second forward duration and second forward intensity; and (iv) at least a rest period; and wherein at least one of the pulses of the first forward duration and the first forward intensity or the pulse of the second forward duration and second forward intensity comprises a higher intensity pulse of a shorter duration within the first forward duration or the second forward duration, wherein the higher intensity pulse has an intensity that is about 100% to about 500% of the intensity of the first forward intensity or the second forward intensity.

\* \* \* \* \*